United States Patent
Bezel et al.

(10) Patent No.: US 10,690,589 B2
(45) Date of Patent: Jun. 23, 2020

(54) LASER SUSTAINED PLASMA LIGHT SOURCE WITH FORCED FLOW THROUGH NATURAL CONVECTION

(71) Applicant: KLA-Tencor Corporation, Milpitas, CA (US)

(72) Inventors: Ilya Bezel, Mountain View, CA (US); Kenneth P. Gross, San Carlos, CA (US); John Szilagyi, Milpitas, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/043,764

(22) Filed: Jul. 24, 2018

(65) Prior Publication Data

US 2019/0033204 A1   Jan. 31, 2019

Related U.S. Application Data

(60) Provisional application No. 62/538,635, filed on Jul. 28, 2018.

(51) Int. Cl.
| | |
|---|---|
| *G01N 21/21* | (2006.01) |
| *H01J 65/04* | (2006.01) |
| *H05H 1/24* | (2006.01) |
| *G01N 21/25* | (2006.01) |

(52) U.S. Cl.
CPC .......... *G01N 21/211* (2013.01); *H01J 65/042* (2013.01); *H05H 1/24* (2013.01); *G01N 21/255* (2013.01)

(58) Field of Classification Search
None
See application file for complete search history.

(56) References Cited

U.S. PATENT DOCUMENTS

| | | | | |
|---|---|---|---|---|
| 5,608,526 A | * | 3/1997 | Piwonka-Corle | .... G01N 21/211 356/369 |
| 5,999,310 A | * | 12/1999 | Shafer | ................ G02B 17/0808 359/351 |
| 6,297,880 B1 | * | 10/2001 | Rosencwaig | ...... G01B 11/0641 356/364 |

(Continued)

FOREIGN PATENT DOCUMENTS

| | | |
|---|---|---|
| EP | 2889536 A1 | 7/2015 |
| JP | 2014231630 A | 12/2014 |

OTHER PUBLICATIONS

International Search Report and Written Opinion dated Nov. 8, 2018 for PCT/US2018/043610.

*Primary Examiner* — Alexander H Taningco
*Assistant Examiner* — Srinivas Sathiraju
(74) *Attorney, Agent, or Firm* — Suiter Swantz pc llo

(57) ABSTRACT

A broadband radiation source is disclosed. The system may include a plasma containment vessel configured to receive laser radiation from a pump source to sustain a plasma within gas flowed through the plasma containment vessel. The plasma containment vessel may be further configured to transmit at least a portion of broadband radiation emitted by the plasma. The system may also include a recirculation gas loop fluidically coupled to the plasma containment vessel. The recirculation gas loop may be configured to transport heated gas from an outlet of the plasma containment vessel, and further configured to transport cooled gas to an inlet of the plasma containment vessel.

50 Claims, 7 Drawing Sheets

(56) References Cited

U.S. PATENT DOCUMENTS

| | | | |
|---|---|---|---|
| 7,525,649 B1* | 4/2009 | Leong | G01N 21/8806 |
| | | | 356/237.1 |
| 8,618,254 B2* | 12/2013 | Giaccia | C07K 14/705 |
| | | | 530/350 |
| 9,099,292 B1* | 8/2015 | Bezel | H01J 1/025 |
| 9,263,238 B2* | 2/2016 | Wilson | H01J 37/32339 |
| 9,558,858 B2* | 1/2017 | Shortt | G21K 5/00 |
| 9,655,225 B2* | 5/2017 | Bezel | H01J 65/04 |
| 9,775,226 B1* | 9/2017 | Bezel | H05H 1/24 |
| 9,927,094 B2* | 3/2018 | Bezel | F21V 9/06 |
| 10,217,625 B2* | 2/2019 | Bezel | H01J 65/04 |
| 10,283,342 B2* | 5/2019 | Bezel | H01J 65/04 |
| 10,381,216 B2* | 8/2019 | Bezel | H01J 65/04 |
| 2007/0002465 A1 | 1/2007 | Chuang et al. | |
| 2009/0180176 A1* | 7/2009 | Armstrong | G02B 17/0812 |
| | | | 359/366 |
| 2013/0114085 A1* | 5/2013 | Wang | G01N 21/55 |
| | | | 356/445 |
| 2013/0181595 A1* | 7/2013 | Bezel | F21V 9/06 |
| | | | 313/112 |
| 2015/0048741 A1* | 2/2015 | Shortt | G21K 5/00 |
| | | | 315/111.41 |
| 2016/0066402 A1* | 3/2016 | Bezel | H01J 65/04 |
| 2016/0268120 A1* | 9/2016 | Bezel | H01J 65/04 |
| 2017/0153145 A1* | 6/2017 | Shchemelinin | G01J 5/0003 |
| 2017/0345639 A1* | 11/2017 | Bezel | H01J 61/025 |
| 2019/0235390 A1* | 8/2019 | Zhao | G03F 7/70033 |

\* cited by examiner

LASER SUSTAINED PLASMA LIGHT SOURCE WITH FORCED FLOW THROUGH NATURAL CONVECTION

CROSS-REFERENCE TO RELATED APPLICATION

The present application claims the benefit under 35 U.S.C. § 119(e) of U.S. Provisional Application Ser. No. 62/538,635, filed Jul. 28, 2017, entitled LSP FORCED FLOW THROUGH NATURAL CONVECTION, naming Ilya Bezel, Ken Gross, and John Szilagyi as inventors, which is incorporated herein by reference in the entirety.

TECHNICAL FIELD

The present invention generally relates to plasma-based light sources, and, more particularly, to laser sustained plasma (LSP) light sources with forced flow through natural convection.

BACKGROUND

As the demand for integrated circuits having ever-smaller device features continues to increase, the need for improved illumination sources used for inspection of these ever-shrinking devices continues to grow. One such illumination source includes a laser-sustained plasma (LSP) source. Laser-sustained plasma light sources are capable of producing high-power broadband light. Laser-sustained plasma light sources operate by focusing laser radiation into a gas volume in order to excite the gas, such as argon, xenon, neon, nitrogen or mixtures thereof, into a plasma state, which is capable of emitting light. This effect is typically referred to as "pumping" the plasma.

The stability of plasma formed within an LSP light source is partially dependent on gas flows within the chamber housing the plasma. Unpredictable gas flows may introduce one or more variables which may hamper the stability of the LSP light source. By way of example, unpredictable gas flows may distort the plasma profile, distort the optical transmission properties of the LSP light source, and result in uncertainty regarding the position of the plasma itself. Previous approaches used to address unstable gas flows have been unable to achieve sufficiently high gas flow rates to sustain a predictable gas flow. Furthermore, those approaches which are capable of sustaining high gas flow rates introduce unwanted noise, require cumbersome, expensive equipment, and require additional safety management procedures.

Therefore, it would be desirable to provide a system and method that cure one or more shortfalls of the previous approaches identified above.

SUMMARY

An apparatus is disclosed, in accordance with one or more embodiments of the present disclosure. In one embodiment, the apparatus includes a plasma containment vessel. In another embodiment, the plasma containment vessel is configured to receive laser radiation from a pump source to sustain a plasma within gas flowed through the plasma containment vessel. In another embodiment, the plasma containment vessel is configured to transport gas from an inlet of the plasma containment vessel to an outlet of the plasma containment vessel, wherein the plasma containment vessel is further configured to transmit at least a portion of broadband radiation emitted by the plasma. In another embodiment, the apparatus includes a recirculation gas loop (e.g., closed recirculation gas loop or open recirculation gas loop) fluidically coupled to the plasma containment vessel. In another embodiment, a first portion of the recirculation gas loop is fluidically coupled to the outlet of the plasma containment vessel and is configured to transport at least one of plasma or heated gas from the outlet of the plasma containment vessel, wherein a second portion of the recirculation gas loop is fluidically coupled to an inlet of the plasma containment vessel and is configured to transport cooled gas to the inlet of the plasma containment vessel.

An apparatus is disclosed, in accordance with one or more embodiments of the present disclosure. In one embodiment, the apparatus includes a pump source configured to generate laser radiation. In another embodiment, the apparatus includes a plasma containment vessel configured to receive the laser radiation from the pump source to sustain a plasma within gas flowed through the plasma containment vessel. In another embodiment, the plasma containment vessel is configured to transport gas from an inlet of the plasma containment vessel to an outlet of the plasma containment vessel. In another embodiment, the apparatus includes a set of collection optics configured to receive broadband radiation emitted by the plasma sustained within the plasma containment vessel. In another embodiment, the apparatus includes a recirculation gas loop fluidically coupled to the plasma containment vessel. In another embodiment, a first portion of the recirculation gas loop is fluidically coupled to the outlet of the plasma containment vessel and is configured to transport at least one of plasma or heated gas out of the plasma containment vessel via the outlet, and a second portion of the closed recirculation gas loop is fluidically coupled to the inlet of the plasma containment vessel and is configured to transport cooled gas into the plasma containment vessel via the inlet.

An optical characterization system is disclosed, in accordance with one or more embodiments of the present disclosure. In one embodiment, the optical characterization system includes a broadband radiation source. In one embodiment, the broadband radiation source includes a pump source configured to generate laser radiation. In another embodiment, the broadband radiation source includes a plasma containment vessel configured to receive the laser radiation from the pump source to sustain a plasma within gas flowed through the plasma containment vessel, wherein the plasma containment vessel is configured to transport gas from an inlet of the plasma containment vessel to an outlet of the plasma containment vessel. In another embodiment, the broadband radiation source includes a set of collection optics configured to receive broadband radiation emitted by the plasma sustained within the plasma containment vessel. In another embodiment, the broadband radiation source includes a recirculation gas loop fluidically coupled to the plasma containment vessel, wherein a first portion of the recirculation gas loop is fluidically coupled to the outlet of the plasma containment vessel and is configured to transport at least one of plasma or heated gas out of the plasma containment vessel via the outlet, wherein a second portion of the recirculation gas loop is fluidically coupled to an inlet of the plasma containment vessel and is configured to transport cooled gas into the plasma containment vessel via the inlet. In another embodiment, the optical characterization system includes a detector assembly. In another embodiment, the optical characterization system includes a set of characterization optics configured to collect a portion of the broadband radiation from the set of collection optics of the broadband radiation source, and direct the broadband radiation onto a specimen, wherein the set of characterization optics is further configured to direct radiation from the specimen to the detector assembly.

A method is disclosed, in accordance with one or more embodiments of the present disclosure. In one embodiment, the method includes directing laser radiation into a plasma containment vessel in order to sustain a plasma within a gas flowing through the plasma containment vessel, wherein the plasma emits broadband radiation. In another embodiment, the method includes recirculating the gas through the plasma containment vessel via a recirculation gas loop, wherein the recirculating the gas through the plasma containment vessel comprises: transporting at least one of plasma or heated gas from the plasma containment vessel to a heat exchanger; cooling the at least one of plasma or heated gas via the heat exchanger; and transporting cooled gas from the heat exchanger to the plasma containment vessel.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Reference will now be made in detail to the subject matter disclosed, which is illustrated in the accompanying drawings.

It is recognized that the stability of plasma formed within an LSP radiation source is partially dependent on gas flows within the chamber housing the plasma. Unpredictable gas flows may introduce one or more variables which may hamper the stability of the LSP radiation source. By way of example, unpredictable gas flows may distort the plasma profile, distort the optical transmission properties of the LSP radiation source, and result in uncertainty regarding the position of the plasma itself. One approach to facilitate the flow of gas within an LSP radiation source is to introduce a recirculation booster pump. However, the utility of conventional pumps is limited. Conventional pumps require high-pressure lines, provisions for servicing the pump, and large, high-pressure ballast volumes in order to remove pressure fluctuations during pump operation. In addition to being cumbersome and expensive, the additional equipment requires additional servicing and safety management due to the large volumes of compressed gas required to operate the pumps. Furthermore, the additional components associated with recirculation pumps introduce a heightened possibility for error or breakdown into the system.

Referring generally to FIGS. 1A-4, systems and methods for generating improved gas flow through a laser-sustained plasma (LSP) radiation source are described, in accordance with one or more embodiments of the present disclosure. Embodiments of the present disclosure are directed to a recirculation gas loop (e.g., closed recirculation gas loop or open recirculation gas loop). Additional embodiments of the present disclosure are directed to buoyancy-driven gas flow recirculation through the recirculation gas loop.

Figure 1A:
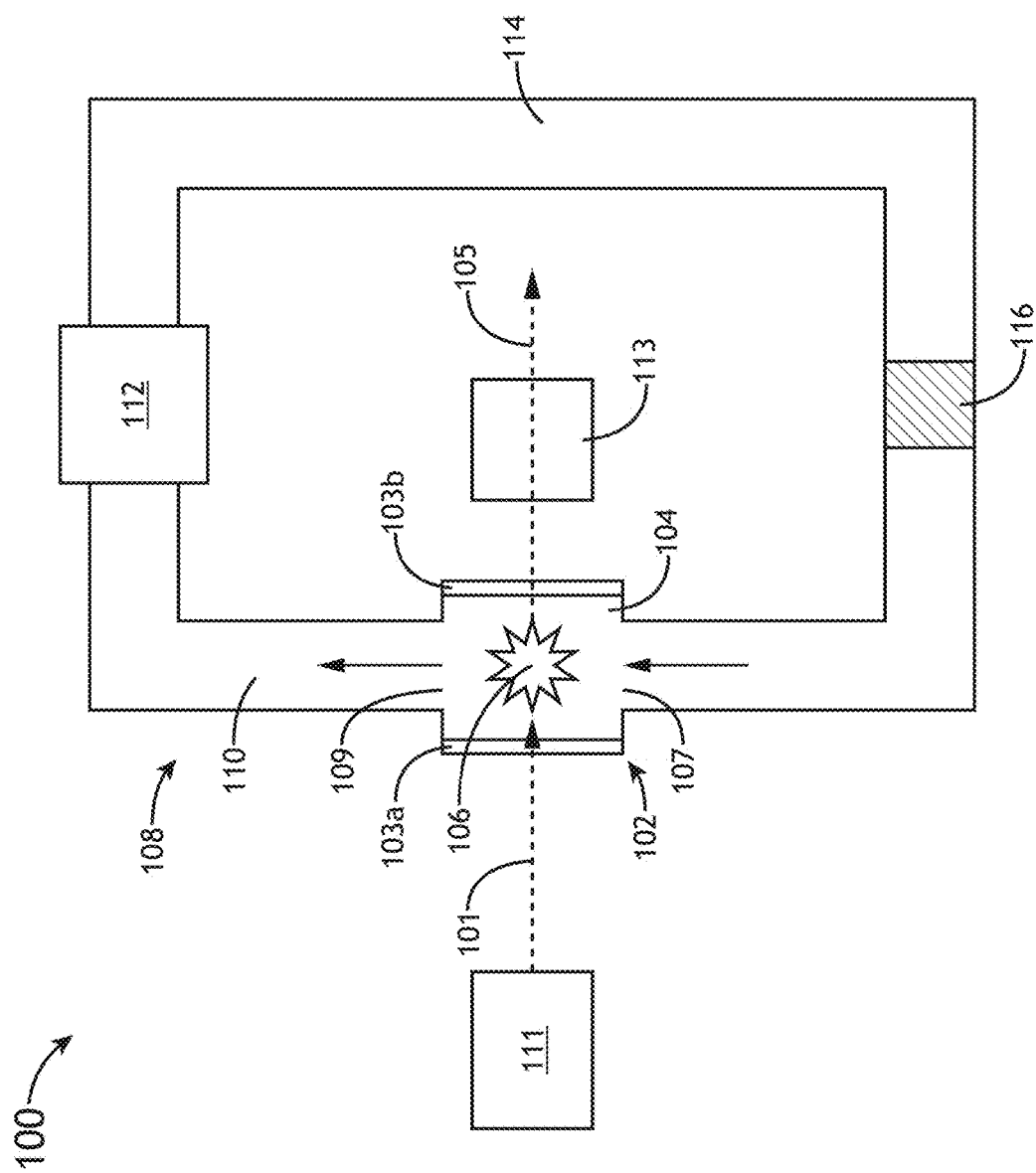
FIG. 1A illustrates a simplified schematic view of a laser-sustained plasma (LSP) radiation source including a closed recirculation gas loop, in accordance with one or more embodiments of the present disclosure.

FIG. 1A illustrates a simplified schematic view of a broadband LSP radiation source 100 in a closed recirculation configuration, in accordance with one or more embodiments of the present disclosure. In one embodiment, LSP radiation source 100 includes a plasma containment vessel 102, a closed recirculation gas loop 108, pump source 111, a set of collection optics 113, a heat exchanger 112, and a cold gas return 114.

In one embodiment, the pump source 111 is configured to generate a pump beam 101 (e.g., laser radiation 101). Pump beam 101 may include radiation of any wavelength or wavelength range known in the art including, but not limited to, infrared (IR) radiation, near infrared (NIR) radiation, ultraviolet (UV) radiation, visible radiation, and the like.

In another embodiment, the pump source 111 directs the pump beam 101 into the plasma containment vessel 102. For example, the plasma containment vessel 102 may include any plasma containment vessel known in the art including, but not limited to, a plasma lamp, a plasma cell, plasma chamber, and the like. By way of another example, the plasma containment vessel 102 may include, but is not limited to, a plasma bulb. In another embodiment, the plasma containment vessel 102 may include one or more transmissive elements 103a. The one or more transmissive elements 103a may transmit the pump beam 101 into a volume of gas 104 contained within plasma containment vessel 102 so as to generate and/or sustain a plasma 106. For example, the one or more transmissive elements 103a may include, but are not limited to, one or more transmissive ports, one or more windows, and the like.

In another embodiment, the LSP source 100 may include one or more pump illumination optics (not shown). The one or more pump illumination optics may include any optical element known in the art for directing and/or focusing the pump beam 101 into the plasma containment vessel 102 including, but not limited to, one or more lenses, one or more mirrors, one or more beam splitters, one or more filters, and the like.

The focusing of the pump beam 101 into the volume of gas 104 causes energy to be absorbed through one or more absorption lines of the gas and/or plasma 106 contained within the volume of gas 104, thereby "pumping" the gas in order to generate and/or sustain the plasma 106. For example, pump beam 101 may be directed and/or focused (e.g., by pump source and/or one or more pump illumination optics) to one or more focal points within the volume of gas 104 contained within plasma containment vessel 102 in order to generate and/or sustain a plasma 106. It is noted herein that the LSP radiation source 100 may include one or more additional ignition sources used to facilitate the generation of the plasma 106 without departing from the spirit or scope of the present disclosure. For example, plasma containment vessel 102 may include one or more electrodes which may initiate the plasma 106.

In another embodiment, the plasma 106 generates broadband radiation 105. In another embodiment, the radiation 105 generated by the plasma 106 exits the plasma containment vessel 102 via one or more additional transmissive elements 103b. The one or more additional transmissive elements 103b may include, but are not limited to, one or more transmissive ports, one or more windows, and the like. It is noted herein that the one or more transmissive elements 103a and the one or more additional transmissive elements 103b may comprise the same transmissive element, or may comprise separate transmissive elements. By way of example, where the plasma containment vessel 102 includes a plasma lamp or a plasma bulb, the one or more transmissive elements 103a and the one or more additional transmissive elements 103b may comprise a single transmissive element.

In another embodiment, LSP radiation source 100 includes a set of collection optics 113. The set of collection optics 113 may include one or more optical elements known in the art configured to collect and/or focus radiation (e.g., radiation 105) including, but not limited to, one or more mirrors, one or more prisms, one or more lenses, one or more diffractive optical elements, one or more parabolic mirrors, one or more elliptical mirrors, and the like. It is recognized herein that the set of collection optics 113 may be configured to collect and/or focus radiation 105 generated by plasma 106 to be used for one or more downstream processes including, but not limited to, imaging processes, inspection processes, metrology processes, lithography processes, and the like.

In another embodiment, the closed recirculation gas loop 108 includes a flue 110, a heat exchanger 112, a cold gas return 114, and/or one or more flow resistance elements 116. The closed recirculation gas loop 108 may be configured to facilitate gas flow through the plasma containment vessel 102. In this regard, the closed recirculation gas loop 108 and/or one or more components of the closed recirculation gas loop 108 may include any components configured to recirculate gas through the plasma containment vessel 102 including, but not limited, one or more pipes, one or more tubes, one or more ducts, and the like. Although the source 100 is described in the context of a single closed recirculation gas loop, such a configuration should not be interpreted as a limitation on the scope of the present disclosure. It is noted that the source 100 may include any number of recirculation gas loops.

In one embodiment, the closed recirculation gas loop 108 utilizes buoyancy-driven gas flow recirculation to enhance gas flow within plasma containment vessel 102. It is contemplated herein that the thermal energy associated with the plume of the plasma 106 may be sufficient to drive recirculation of gas through the closed recirculation gas loop 108. In some embodiments, the buoyancy of the plume of the plasma 106 is sufficient to drive recirculation through the recirculation gas loop 108 without mechanical assistance (e.g., pump assistance).

In one embodiment, the plasma containment vessel 102 is fluidically coupled to a flue 110 via an outlet 109. In another embodiment, gas exits the plasma containment vessel 102 through outlet 109 into the flue 110. As noted previously herein, the plume and/or heated gas generated by the plasma 106 may drive gas up through the outlet 109 of the plasma containment vessel 102.

In another embodiment, heated gas travels through the flue 110 to a heat exchanger 112. Heat exchanger 112 may include any heat exchanger known in the art including, but not limited to, a water-cooled heat exchanger or a cryogenic heat exchanger (e.g., liquid nitrogen cooled, liquid argon cooled, or liquid helium cooled). In one embodiment, the heat exchanger 112 is configured to remove thermal energy from the heated gas within the closed recirculation gas loop 108. For example, heat exchanger 112 may remove thermal energy from the heated gas within the closed recirculation gas loop 108 by transferring at least a portion of the thermal energy to a heat sink.

In another embodiment, gas circulates through the heat exchanger 112 to the cold gas return 114. In another embodiment, cold gas return 114 is fluidically coupled to the plasma containment vessel 102 via an inlet 107.

In one embodiment, the recirculation gas loop 108 of the present disclosure may be configured to maintain a temperature and/or pressure difference between various portions of the recirculation gas loop 108 sufficient to drive recirculation through the recirculation gas loop 108. In one embodiment, the closed recirculation gas loop 108 may be configured to maintain a temperature difference (and thereby a pressure difference) between the flue 110 and the cold gas return 114 which is sufficient to drive gas through the closed recirculation gas loop 108. For example, the closed recirculation gas loop 108 may be configured to maintain a temperature difference of at least 100° C. between the flue 110 and the cold gas return 114 such that the gas in the flue 110 is at least 100° C. hotter than the gas in the cold gas return 114. For instance, the closed recirculation gas loop 108 may be configured such that the gas in the flue 110 is greater than 500° C., and the gas in the cold gas return 114 is less than 400° C. In another embodiment, the closed recirculation gas loop 108 may be configured to maintain a temperature in the cold gas return 114 that is lower than 20° C.

In a similar manner, the closed recirculation gas loop 108 may be described as maintaining a pressure difference between various portions of the closed recirculation gas loop 108. In this regard, closed recirculation gas loop 108 may be configured to maintain a pressure difference between the flue 110 and the cold gas return 114 such that the pressure in the flue 110 is higher than that in the cold gas return 114. For example, closed recirculation gas loop 108 may be configured to maintain a pressure difference such that the pressure in the flue 110 is at least 500 Pa higher than the pressure in the cold gas return 114. By way of another example, closed recirculation gas loop 108 may be configured to maintain a pressure difference such that the pressure in the flue 110 is at least 1200 Pa higher than the pressure in the cold gas return 114.

It is further contemplated that the system 100 may be operated such that the energy of a plume of the plasma 106 is sufficient to drive recirculation of the gas through the closed recirculation gas loop 108 at a velocity greater than or equal to 0.2 m/s. In addition, the system 100 may be operated such that the plume of the plasma extends at least 1 cm above the plasma. Further, the plume and/or plasma may behave as a discontinuous fluid through one or more portions of the closed recirculation gas loop 108.

The one or more flow resistance elements 116 may include any elements configured to adjust the flow rate of gas flowing through the closed recirculation gas loop 108. For example, the one or more flow resistance elements 116 may include an aperture disposed within one or more portions of the closed recirculation gas loop 108. By way of another example, the one or more flow resistance elements 116 may include, but are not limited to, one or more filters and/or purifiers disposed within one or more portions of the closed recirculation gas loop 108. The one or more filters may include any filter known in the art such as, but not limited to, one or more particle filters or one or more mechanical contaminant filters. It is contemplated herein that one or more filters within the closed recirculation gas loop 108 may serve to remove impurities from the gas before recirculating into the plasma containment vessel 102, thereby preventing and/or minimizing contamination and buildup which could negatively affect one or more optical properties of radiation 105.

The gas recirculated through closed recirculation gas loop 108 may include, but is not limited to, argon, xenon, neon, nitrogen or mixtures thereof. By further way of example, the gas recirculated through recirculation gas loop 108 may include a mixture of two or more gasses. It is noted herein that enhanced, fast-flow gas within plasma containment vessel 102 may promote stable plasma 106 generation. In a similar regard, it is noted herein that stable plasma 106 generation may generate radiation 105 with one or more substantially constant properties.

Figure 1B:
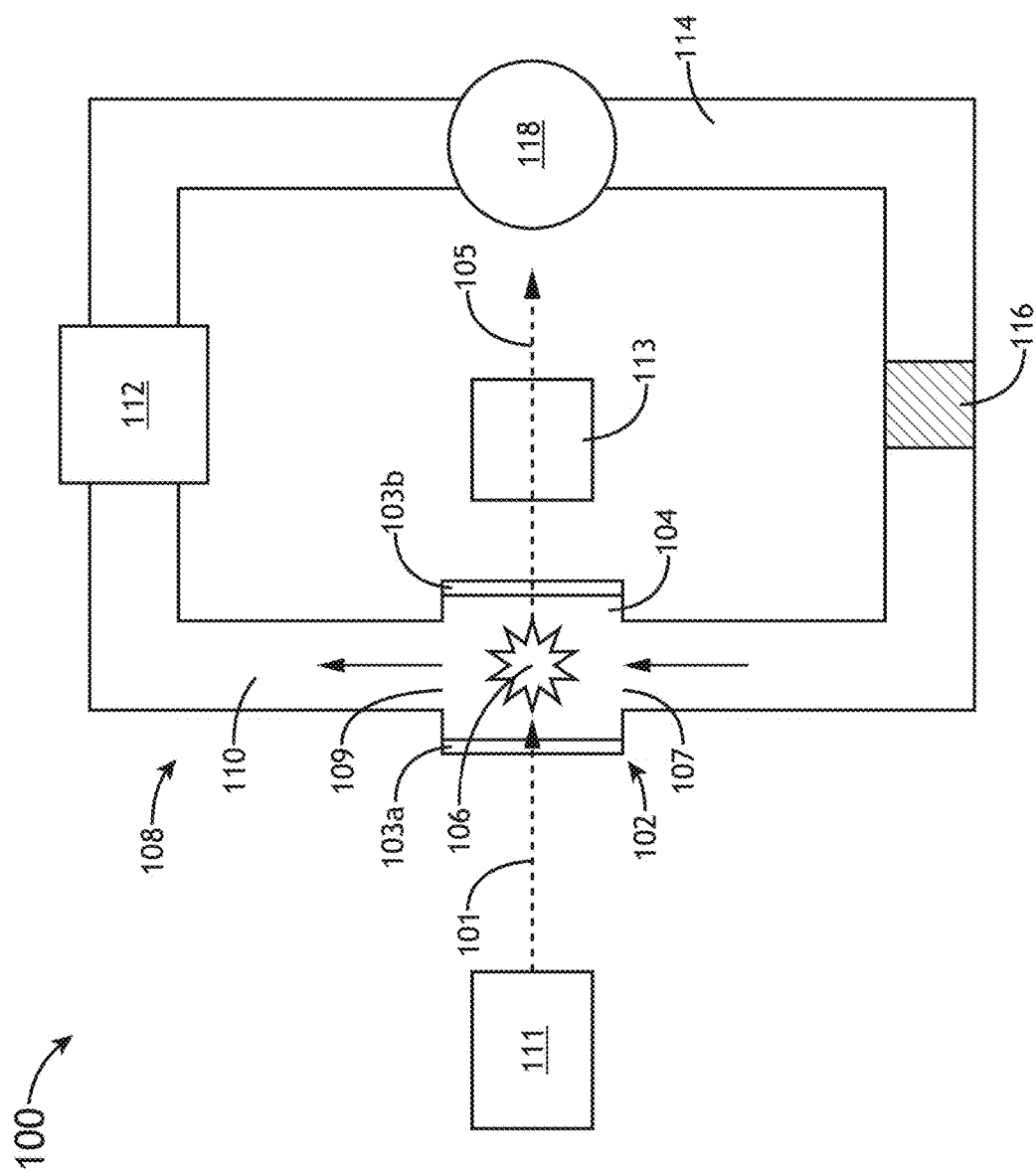
FIG. 1B illustrates a simplified schematic view of a laser-sustained plasma (LSP) radiation source equipped with a pump, in accordance with one or more embodiments of the present disclosure.
Figure 1C:
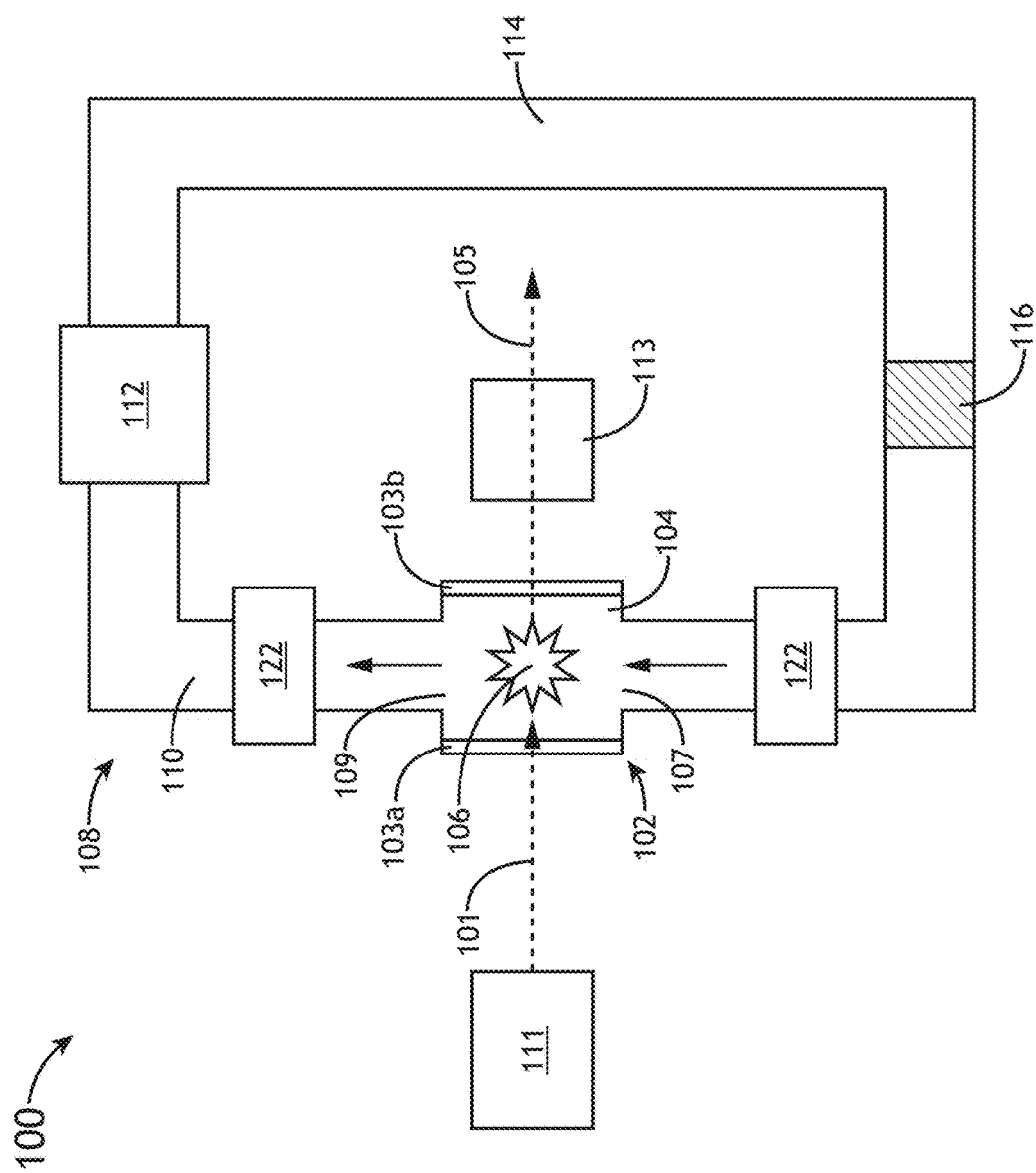
FIG. 1C illustrates a simplified schematic view of a laser-sustained plasma (LSP) radiation source equipped with one or more additional heat sources, in accordance with one or more embodiments of the present disclosure.

Although much of the present disclosure has focused on a configuration whereby gas flow is driven by the energy of the plasma and/or buoyancy of the plume, such a configuration should not be interpreted as a limitation on the scope of the present disclosure. In some embodiments, as shown in FIG. 1B, the source 100 may include one or more pumps 118 to provide force convection within the closed recirculation loop 108 and assist the recirculation of gas in the closed recirculation loop 108. In additional and/or alternative embodiments, as shown in FIG. 1C, the LSP radiation source 100 includes one or more additional heat sources. An additional heat source may be configured to at least partially drive recirculation of the gas through the closed recirculation gas loop 108. For example, closed recirculation gas loop 108 may include an additional heat source 122 disposed within the flue 110. The additional heat source may be configured to increase the temperature of the gas in the flue 110, thereby increasing the temperature difference between the flue 110 and the cold gas return 114 and assisting with the recirculation of gas in the closed recirculation loop 108. For example, the one or more additional heat sources 122 may be located above and/or below the plasma 106.

It is further noted that pump radiation 101 from the pump source 111 and/or broadband radiation 105 emitted from the plasma 106 may be absorbed by one or more portions of the closed recirculation loop 108. The absorption of laser radiation 101 and/or broadband radiation 105 may increase the temperature difference between the flue 110 and the cold gas return 114 and assist with the recirculation of gas in the closed recirculation loop 108.

Figure 1D:
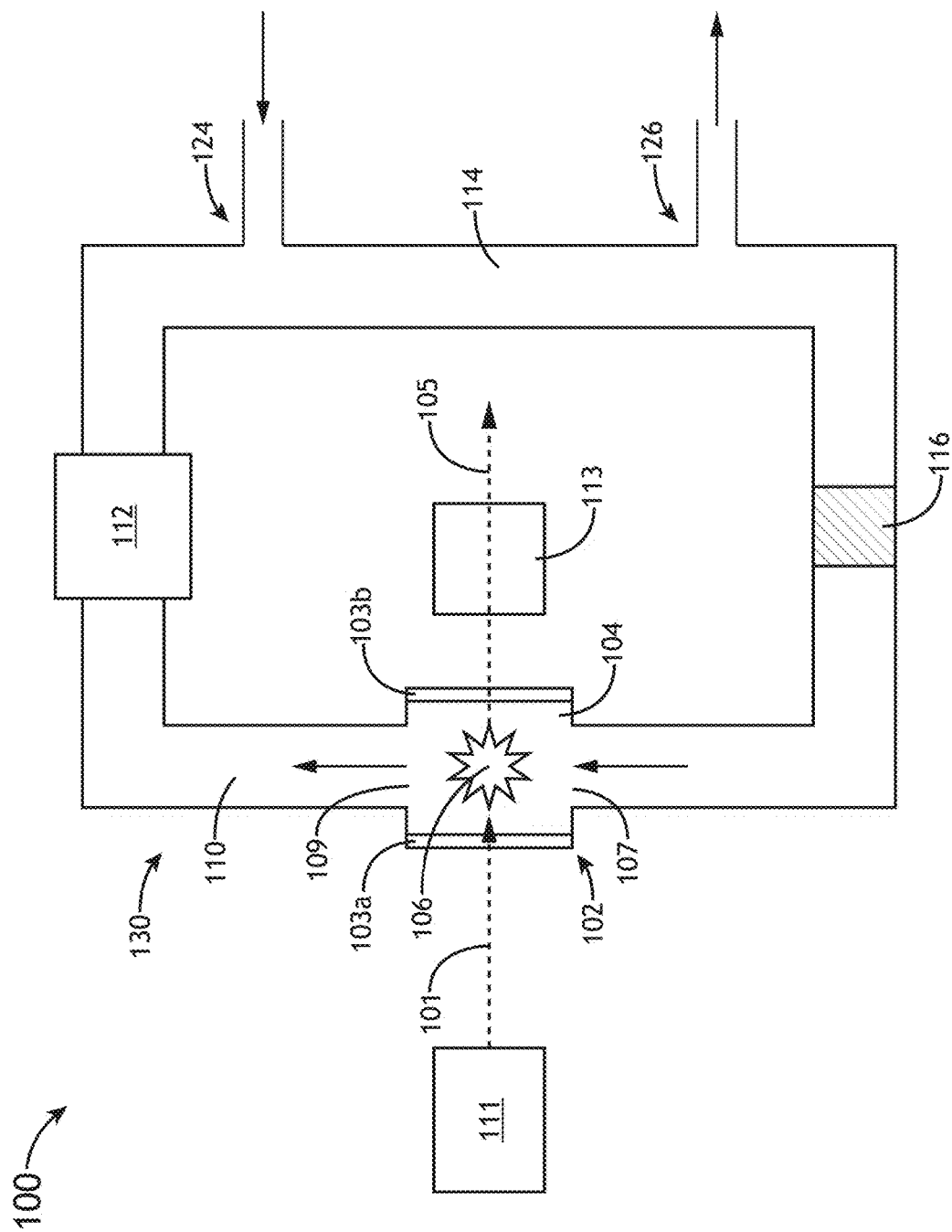
FIG. 1D illustrates a simplified schematic view of a laser-sustained plasma (LSP) radiation source including an open recirculation gas loop, in accordance with one or more embodiments of the present disclosure.

FIG. 1D illustrates a simplified schematic view of a laser sustained plasma (LSP) radiation source in an open configuration, in accordance with one or more embodiments of the present disclosure. Although much of the present disclosure has focused on a closed recirculation configuration, such a configuration should not be interpreted as a limitation on the scope of the present disclosure. In some embodiments, as shown in FIG. 1D, the source 100 may include an open recirculation gas loop 130. In this embodiment, the open recirculation gas loop 130 may include a gas refill system. The gas refill system may include a gas inlet 124 and/or a gas outlet 126 for filling the loop 130 with gas and draining the loop 130 of gas. In this regard, the gas within the open recirculation gas loop 130 may be selectively altered or altogether replaced. The gas replace system may be used to alter or replace the gas while the source 100 is in operation or when the source 100 is offline. It is noted herein that the description of the various components and embodiments associated with the closed recirculation gas loop of FIGS. 1A-1C should be interpreted to extend to the open recirculation gas loop 130 unless otherwise noted.

Referring generally to FIGS. 1A-1D, in one embodiment, pump source 111 may include one or more lasers. In a general sense, pump source 111 may include any laser system known in the art. For instance, the pump source 111 may include any laser system known in the art capable of emitting radiation in the infrared, visible or ultraviolet portions of the electromagnetic spectrum. In one embodiment, the pump source 111 may include a laser system configured to emit continuous wave (CW) laser radiation. For example, the pump source 102 may include one or more CW infrared laser sources. For instance, in settings where the gas within the gas containment structure 102 is or includes argon, the pump source 111 may include a CW laser (e.g., fiber laser or disc Yb laser) configured to emit radiation at 1069 nm. It is noted that this wavelength fits to a 1068 nm absorption line in argon and as such is particularly useful for pumping argon gas. It is noted herein that the above description of a CW laser is not limiting, and any laser known in the art may be implemented in the context of the present invention.

In another embodiment, the pump source 111 may include one or more diode lasers. For example, the pump source 111 may include one or more diode lasers emitting radiation at a wavelength corresponding with any one or more absorption lines of the species of the gas contained within the plasma containment vessel 102. In a general sense, a diode laser of pump source 111 may be selected for implementation such that the wavelength of the diode laser is tuned to any absorption line of any plasma 106 (e.g., ionic transition line) or any absorption line of the plasma-producing gas (e.g., highly excited neutral transition line) known in the art. As such, the choice of a given diode laser (or set of diode lasers) will depend on the type of gas contained within the plasma containment vessel 102 of LSP radiation source 100.

In another embodiment, the pump source 111 may include an ion laser. For example, the pump source 111 may include any noble gas ion laser known in the art. For instance, in the case of an argon-based plasma, the pump source 111 used to pump argon ions may include an Ar+ laser.

In another embodiment, the pump source 111 may include one or more frequency converted laser systems. For example, the pump source 111 may include a Nd:YAG or Nd:YLF laser having a power level exceeding 100 watts. In another embodiment, the pump source 111 may include a broadband laser. In another embodiment, the pump source 111 may include a laser system configured to emit modulated laser radiation or pulsed laser radiation.

In another embodiment, the pump source 111 may include one or more lasers configured to provide laser light at substantially a constant power to the plasma 106. In another embodiment, the pump source 111 may include one or more modulated lasers configured to provide modulated laser light to the plasma 106. In another embodiment, the pump source 111 may include one or more pulsed lasers configured to provide pulsed laser light to the plasma 106.

In another embodiment, the pump source 111 may include one or more non-laser sources. In a general sense, the pump source 111 may include any non-laser light source known in the art. For instance, the pump source 111 may include any non-laser system known in the art capable of emitting radiation discretely or continuously in the infrared, visible or ultraviolet portions of the electromagnetic spectrum.

In another embodiment, the pump source 111 may include two or more light sources. In one embodiment, the pump source 111 may include two or more lasers. For example, the pump source 111 (or "sources") may include multiple diode lasers. By way of another example, the pump source 111 may include multiple CW lasers. In another embodiment, each of the two or more lasers may emit laser radiation tuned to a different absorption line of the gas or plasma 106 within the plasma containment vessel 102. In this regard, the multiple pulse sources may provide illumination of different wavelengths to the gas within the plasma containment vessel 102.

Figure 2:
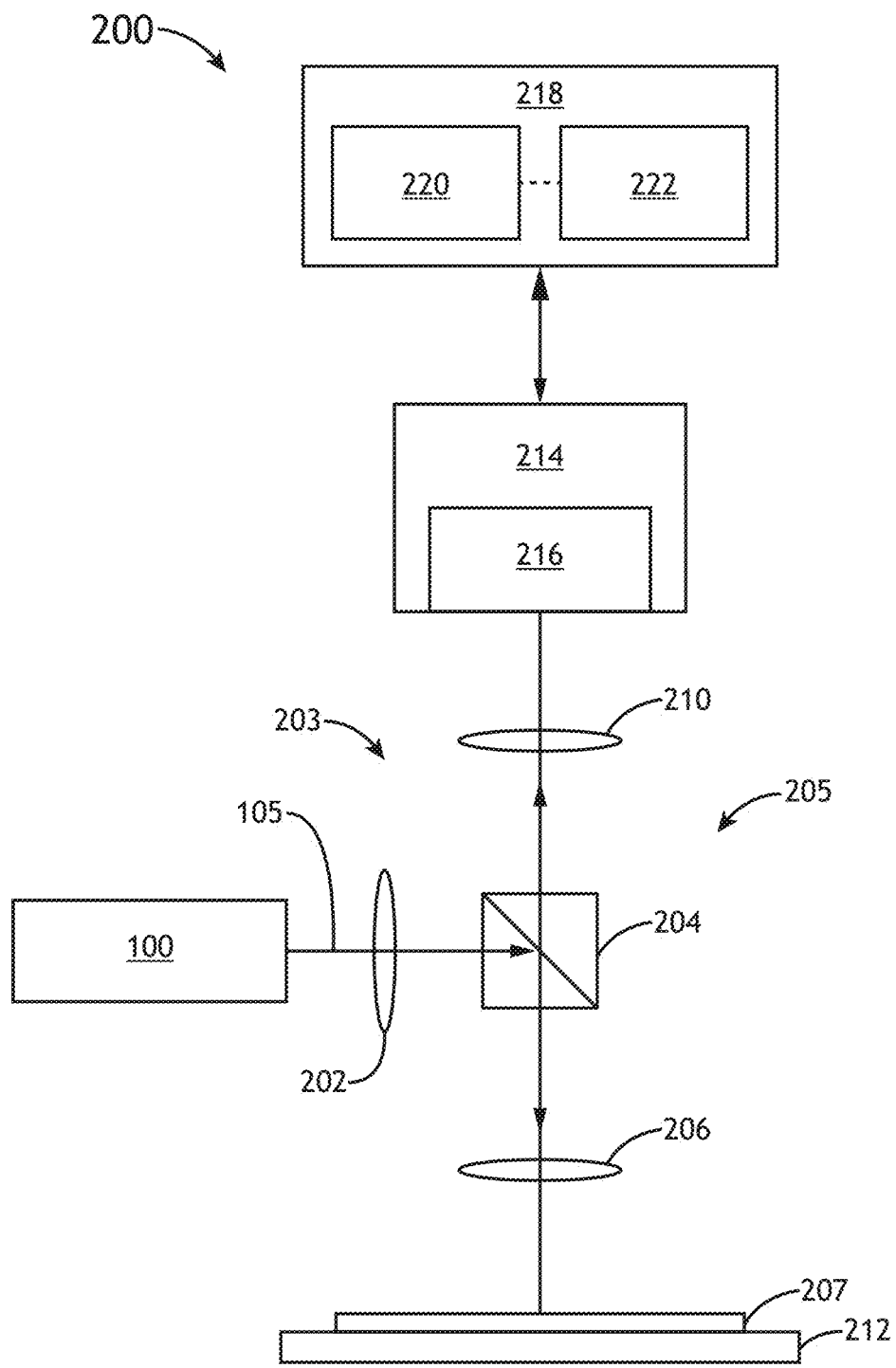
FIG. 2 illustrates a simplified schematic view of an optical characterization system implementing the LSP radiation source, in accordance with one or more embodiments of the present disclosure.

FIG. 2 illustrates a simplified schematic view of an optical characterization system 200 implementing the LSP radiation source 100, in accordance with one or more embodiments of the present disclosure. In one embodiment, system 200 includes the LSP radiation source 100, an illumination arm 203, a collection arm 205, a detector assembly 214, and a controller 218 including one or more processors 220 and memory 222.

It is noted herein that system 200 may comprise any imaging, inspection, metrology, lithography, or other characterization system known in the art. In this regard, system 200 may be configured to perform inspection, optical metrology, lithography, and/or any form of imaging on a specimen 207. Specimen 207 may include any sample known in the art including, but not limited to, a wafer, a reticle/photomask, and the like. It is noted that system 200 may incorporate one or more of the various embodiments of the LSP radiation source 100 described throughout the present disclosure.

In one embodiment, specimen 207 is disposed on a stage assembly 212 to facilitate movement of specimen 207. Stage assembly 212 may include any stage assembly 212 known in the art including, but not limited to, an X-Y stage, an R-θ stage, and the like. In another embodiment, stage assembly 212 is capable of adjusting the height of specimen 207 during inspection or imaging to maintain focus on the specimen 207.

In another embodiment, the illumination arm 203 is configured to direct radiation 105 from the LSP radiation source 100 to the specimen 207. The illumination arm 203 may include any number and type of optical components known in the art. In one embodiment, the illumination arm 203 includes one or more optical elements 202, a beam splitter 204, and an objective lens 206. In this regard, illumination arm 203 may be configured to focus radiation 105 from the LSP radiation source 100 onto the surface of the specimen 207. The one or more optical elements 202 may include any optical element or combination of optical elements known in the art including, but not limited to, one or more mirrors, one or more lenses, one or more polarizers, one or more gratings, one or more filters, one or more beam splitters, and the like.

In another embodiment, the collection arm 205 is configured to collect light reflected, scattered, diffracted, and/or emitted from specimen 207. In another embodiment, collection arm 205 may direct and/or focus the light from the specimen 207 to a sensor 216 of a detector assembly 214. It is noted that sensor 216 and detector assembly 214 may include any sensor and detector assembly known in the art. The sensor 216 may include, but is not limited to, a charge-coupled device (CCD) detector, a complementary metal-oxide semiconductor (CMOS) detector, a time-delay integration (TDI) detector, a photomultiplier tube (PMT), an avalanche photodiode (APD), and the like. Further, sensor 216 may include, but is not limited to, a line sensor or an electron-bombarded line sensor.

In another embodiment, detector assembly 214 is communicatively coupled to a controller 218 including one or more processors 220 and memory 222. For example, the one or more processors 220 may be communicatively coupled to memory 222, wherein the one or more processors 220 are configured to execute a set of program instructions stored on memory 222. In one embodiment, the one or more processors 220 are configured to analyze the output of detector assembly 214. In one embodiment, the set of program instructions are configured to cause the one or more processors 220 to analyze one or more characteristics of specimen 207. In another embodiment, the set of program instructions are configured to cause the one or more processors 220 to modify one or more characteristics of system 200 in order to maintain focus on the specimen 207 and/or the sensor 216. For example, the one or more processors 220 may be configured to adjust the objective lens 206 or one or more optical elements 202 in order to focus radiation 105 from LSP radiation source 100 onto the surface of the specimen 207. By way of another example, the one or more processors 220 may be configured to adjust the objective lens 206 and/or one or more optical elements 210 in order to collect illumination from the surface of the specimen 207 and focus the collected illumination on the sensor 216.

It is noted that the system 200 may be configured in any optical configuration known in the art including, but not limited to, a dark-field configuration, a bright-field orientation, and the like.

It is noted herein that the one or more components of system 200 may be communicatively coupled to the various other components of system 200 in any manner known in the art. For example, the LSP radiation source 100, detector assembly 214, controller 218, and one or more processors 220 may be communicatively coupled to each other and other components via a wireline (e.g., copper wire, fiber optic cable, and the like) or wireless connection (e.g., RF coupling, IR coupling, data network communication (e.g., WiFi, WiMax, Bluetooth and the like).

Figure 3:
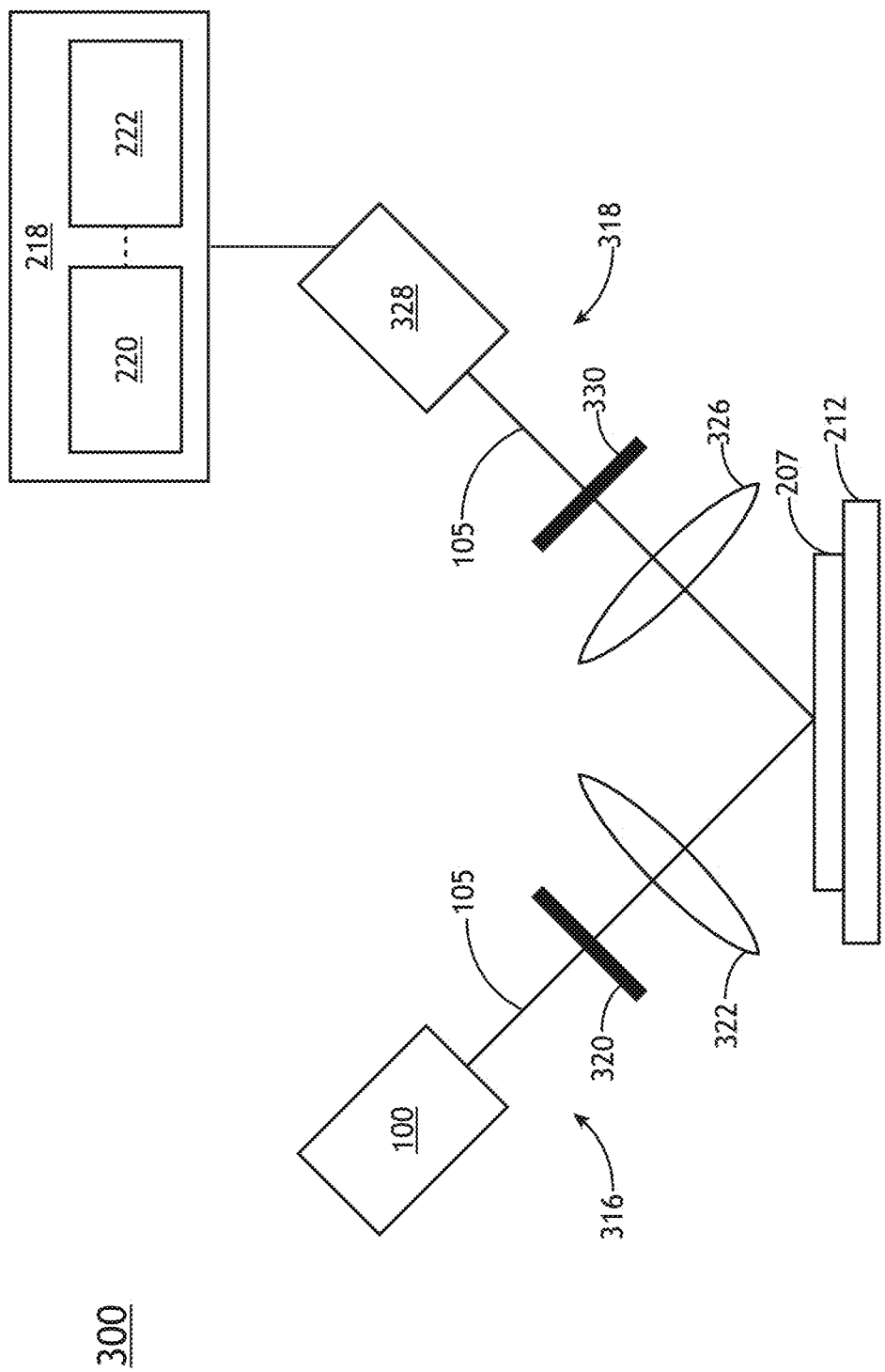
FIG. 3 illustrates a simplified schematic view of an optical characterization system implementing the LSP radiation source, in accordance with one or more embodiments of the present disclosure.

FIG. 3 illustrates a simplified schematic diagram of an optical characterization system 300 arranged in a reflectometry and/or ellipsometry configuration, in accordance with one or more embodiments of the present disclosure. It is noted that the various embodiments and components described with respect to FIG. 2 may be interpreted to extend to the system of FIG. 3. The system 300 may include any type of metrology system known in the art.

In one embodiment, system 300 includes the LSP radiation source 100, an illumination arm 316, a collection arm 318, a detector assembly 328, and the controller 218 including the one or more processors 220 and memory 222.

In this embodiment, the broadband radiation 105 from the LSP radiation source 100 is directed to the specimen 207 via the illumination arm 316. In another embodiment, the system 300 collects radiation emanating from the specimen via the collection arm 318. The illumination arm pathway 316 may include one or more beam conditioning components 320 suitable for modifying and/or conditioning the broadband beam 105. For example, the one or more beam conditioning components 320 may include, but are not limited to, one or more polarizers, one or more filters, one or more beam splitters, one or more diffusers, one or more homogenizers, one or more apodizers, one or more beam shapers, or one or more lenses.

In another embodiment, the illumination arm 316 may utilize a first focusing element 322 to focus and/or direct the beam 105 onto the specimen 207 disposed on the specimen stage 212. In another embodiment, the collection arm 318 may include a second focusing element 326 to collect radiation from the specimen 207.

In another embodiment, the detector assembly 328 is configured to capture radiation emanating from the specimen 207 through the collection arm 318. For example, the detector assembly 328 may receive radiation reflected or scattered (e.g., via specular reflection, diffuse reflection, and the like) from the specimen 207. By way of another example, the detector assembly 328 may receive radiation generated by the specimen 207 (e.g., luminescence associated with absorption of the beam 105, and the like). It is noted that detector assembly 328 may include any sensor and detector assembly known in the art. The sensor may include, but is not limited to, CCD detector, a CMOS detector, a TDI detector, a PMT, an APD, and the like.

The collection arm 318 may further include any number of collection beam conditioning elements 330 to direct and/or modify illumination collected by the second focusing element 326 including, but not limited to, one or more lenses, one or more filters, one or more polarizers, or one or more phase plates.

The system 300 may be configured as any type of metrology tool known in the art such as, but not limited to, a spectroscopic ellipsometer with one or more angles of illumination, a spectroscopic ellipsometer for measuring Mueller matrix elements (e.g., using rotating compensators), a single-wavelength ellipsometer, an angle-resolved ellipsometer (e.g., a beam-profile ellipsometer), a spectroscopic reflectometer, a single-wavelength reflectometer, an angle-resolved reflectometer (e.g., a beam-profile reflectometer), an imaging system, a pupil imaging system, a spectral imaging system, or a scatterometer.

A description of an inspection/metrology tools suitable for implementation in the various embodiments of the present disclosure are provided in U.S. patent application Ser. No. 13/544,954, entitled "Wafer Inspection," filed on Jul. 9, 2012; U.S. Published Patent Application 2009/0180176, entitled "Split Field Inspection System Using Small Catadioptric Objectives," published on Jul. 16, 2009; U.S. Published Patent Application 2007/0002465, entitled "Beam Delivery System for Laser Dark-Field Illumination in a Catadioptric Optical System," published on Jan. 4, 2007; U.S. Pat. No. 5,999,310, entitled "Ultra-broadband UV Microscope Imaging System with Wide Range Zoom Capability," issued on Dec. 7, 1999; U.S. Pat. No. 7,525,649 entitled "Surface Inspection System Using Laser Line Illumination with Two Dimensional Imaging," issued on Apr. 28, 2009; U.S. Published Patent Application 2013/0114085, entitled "Dynamically Adjustable Semiconductor Metrology System," by Wang et al. and published on May 9, 2013; U.S. Pat. No. 5,608,526, entitled "Focused Beam Spectroscopic Ellipsometry Method and System," by Piwonka-Corle et al., issued on Mar. 4, 1997; and U.S. Pat. No. 6,297,880, entitled "Apparatus for Analyzing Multi-Layer Thin Film Stacks on Semiconductors," by Rosencwaig et al., issued on Oct. 2, 2001, which are each incorporated herein by reference in their entirety.

The one or more processors 220 of the present disclosure may include any one or more processing elements known in the art. In this sense, the one or more processors 220 may include any microprocessor-type device configured to execute software algorithms and/or instructions. It should be recognized that the steps described throughout the present disclosure may be carried out by a single computer system or, alternatively, multiple computer systems. In general, the term "processor" may be broadly defined to encompass any device having one or more processing and/or logic elements, which execute program instructions from a non-transitory memory medium 222. Moreover, different subsystems of the various systems disclosed may include processor and/or logic elements suitable for carrying out at least a portion of the steps described throughout the present disclosure.

The memory medium 222 may include any storage medium known in the art suitable for storing program instructions executable by the associated one or more processors 220. For example, the memory medium 222 may include a non-transitory memory medium. For instance, the memory medium 222 may include, but is not limited to, a read-only memory, a random access memory, a magnetic or optical memory device (e.g., disk), a magnetic tape, a solid state drive, and the like. In another embodiment, the memory 222 is configured to store one or more results and/or outputs of the various steps described herein. It is further noted that memory 222 may be housed in a common controller housing with the one or more processors 220. In an alternative embodiment, the memory 222 may be located remotely with respect to the physical location of the one or more processors 220. For instance, the one or more processors 220 may access a remote memory (e.g., server), accessible through a network (e.g., internet, intranet, and the like). In this regard, the one or more processors 222 of the controller 218 may execute any of the various process steps described throughout the present disclosure.

In some embodiments, the LSP radiation source 100 and systems 200, 300, as described herein, may be configured as a "stand alone tool," interpreted herein as a tool that is not physically coupled to a process tool. In other embodiments, such an inspection or metrology system may be coupled to a process tool (not shown) by a transmission medium, which may include wired and/or wireless portions. The process tool may include any process tool known in the art such as a lithography tool, an etch tool, a deposition tool, a polishing tool, a plating tool, a cleaning tool, or an ion implantation tool. The results of inspection or measurement performed by the systems described herein may be used to alter a parameter of a process or a process tool using a feedback control technique, a feedforward control technique, and/or an in-situ control technique. The parameter of the process or the process tool may be altered manually or automatically.

The embodiments of the LSP radiation source 100 and systems 200, 300 may be further configured as described herein. In addition, the LSP radiation source 100 and systems 200, 300 may be configured to perform any other step(s) of any of the method embodiment(s) described herein.

Figure 4:
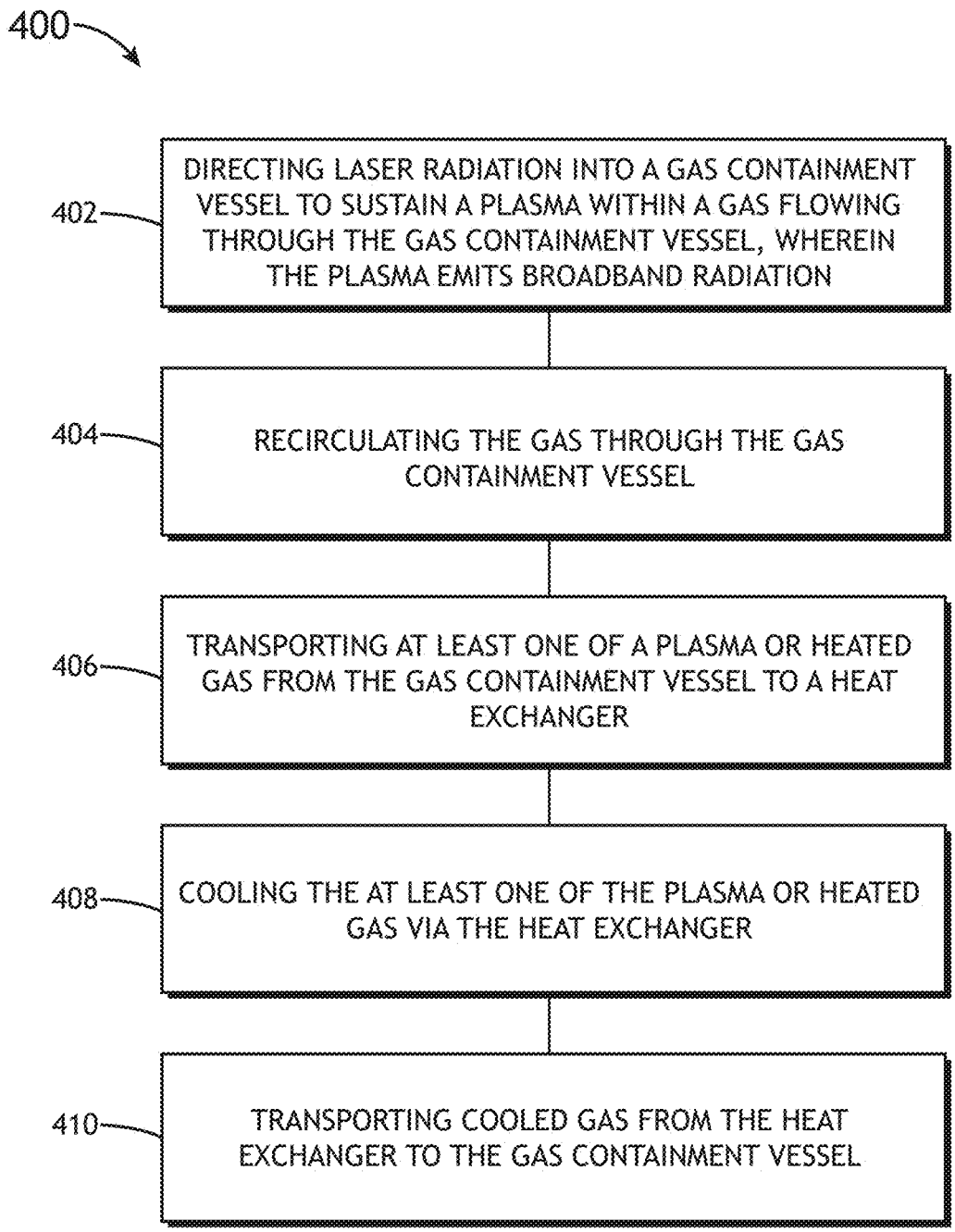
FIG. 4 illustrates a flow diagram depicting a method for generating broadband radiation, in accordance with one or more embodiments of the present disclosure.

FIG. 4 illustrates a flow diagram depicting a method 400 for generating broadband radiation, in accordance with one or more embodiments of the present disclosure. It is noted herein that the steps of method 400 may be implemented all or in part by LSP radiation source 100. It is further recognized, however, that the method 400 is not limited to the LSP radiation source 100 in that additional or alternative system-level embodiments may carry out all or part of the steps of method 400.

In step 402, laser radiation is directed into a plasma containment vessel to sustain a plasma within a gas flowing through the plasma containment vessel, wherein the plasma emits broadband radiation. For example, a pump source 111 may direct a pump beam 101 into a plasma containment vessel 102 to generate plasma 106. The plasma 106 may then generate broadband radiation 105.

In step 404, the gas is recirculated through the plasma containment vessel via a recirculation gas loop. By way of example, the LSP radiation source 100 may include a closed recirculation gas loop 108, as depicted in FIG. 1A, or an open recirculation gas loop 130, as depicted in FIG. 1D. In one embodiment, the recirculation gas loop 108 and/or 130 includes a flue 110, a heat exchanger 112, a cold gas return 114, and one or more flow resistance elements 116. In one embodiment, closed recirculation gas loop 108 utilizes buoyancy-driven gas flow recirculation to enhance gas flow within plasma containment vessel 102.

In step 406, at least one of a plasma or heated gas from the plasma containment vessel is transported to a heat exchanger. For example, the closed recirculation gas loop 108 fluidically coupled to the plasma containment vessel 102 may direct plasma and/or heated gas to the heat exchanger 112. The heat exchanger 112 may include any heat exchanger known in the art including, but not limited to, a water-cooled heat exchanger or a cryogenically-cooled heat exchanger (e.g., liquid nitrogen, liquid argon, or liquid helium).

In step 408, at least one of the plasma or heated gas is cooled via the heat exchanger. For example, heat exchanger 112 may remove thermal energy from the heated gas within the closed recirculation gas loop by transferring at least a portion of the thermal energy to a heat sink. In this regard, heat exchanger 112 may generate a pressure difference between a first portion of the closed recirculation gas loop 108 (e.g., flue 110) and a second portion of the closed recirculation gas loop 108 (e.g., cold gas return 114).

In step 410, cooled gas from the heat exchanger is transported to the plasma containment vessel. For example, the closed recirculation gas loop 108 may be fluidically coupled to the plasma containment vessel 102 via an inlet 107. In another embodiment, the closed recirculation gas loop 108 may include one or more flow resistance elements 116 (e.g., aperture, filter, and/or purifier).

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

Embodiments of the present disclosure are directed to a buoyancy-driven closed recirculation gas loop for facilitating fast gas flow through in an LSP radiation source.

Advantageously, the LSP radiation source 100 of the present disclosure may include fewer mechanically actuated components than do previous approaches. Thus, the LSP radiation source 100 of the present disclosure may produce less noise, require smaller volumes of gas, and require lower maintenance costs and safety management.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An apparatus comprising:
a plasma containment vessel configured to receive laser radiation from a pump source to sustain a plasma within gas flowed through the plasma containment vessel, wherein the plasma containment vessel is configured to transport gas from an inlet of the plasma containment vessel to an outlet of the plasma containment vessel, wherein the plasma containment vessel is further configured to transmit at least a portion of broadband radiation emitted by the plasma; and
one or more closed recirculation gas loops fluidically coupled to the plasma containment vessel, wherein a first portion of the one or more closed recirculation gas loops are fluidically coupled to the outlet of the plasma containment vessel and is configured to transport at least one of plasma or heated gas from the outlet of the plasma containment vessel, wherein a second portion of the one or more closed recirculation gas loops is fluidically coupled to the inlet of the plasma containment vessel and is configured to transport cooled gas to the inlet of the plasma containment vessel, wherein the one or more closed recirculation loops are configured to maintain a temperature difference of at least 100° C. between the first portion of the one or more closed recirculation gas loops and the second portion of the one or more closed recirculation gas loops to generate a pressure difference, wherein the first portion is hotter than the second portion.

2. The apparatus of claim 1, wherein the buoyancy of a plume of the plasma is sufficient to drive recirculation of the gas through the one or more closed recirculation gas loops.

3. The apparatus of claim 1, wherein the energy of a plume of the plasma is sufficient to drive recirculation of the gas through the one or more closed recirculation gas loops.

4. The apparatus of claim 1, wherein the energy of a plume of the plasma is sufficient to drive recirculation of the gas through the one or more closed recirculation gas loops at a velocity greater than or equal to 0.2 m/s.

5. The apparatus of claim 1, wherein the one or more closed recirculation gas loops are configured to generate a plume of the plasma extending at least 1 cm above the plasma.

6. The apparatus of claim 1, wherein the one or more closed recirculation gas loops are configured to generate a pressure difference between gas within the first portion of the one or more closed recirculation gas loops and gas within the second portion of the one or more closed recirculation gas loops to drive gas flow through the one or more closed recirculation gas loops.

7. The apparatus of claim 6, wherein the pressure difference is greater than or equal to 500 Pa.

8. The apparatus of claim 1, further comprising:
one or more additional heat sources, wherein the one or more additional heat sources are configured to at least partially drive recirculation of the gas through the one or more closed recirculation gas loops.

9. The apparatus of claim 1, further comprising:
one or more pumps, wherein the one or more pumps are configured to at least partially drive recirculation of the gas through the one or more closed recirculation gas loops.

10. The apparatus of claim 1, where the first portion of the one or more closed recirculation gas loops comprises a flue fluidically coupled to the outlet of the plasma containment vessel.

11. The apparatus of claim 10, where the second portion of the one or more closed recirculation loops comprises a cold gas return fluidically coupled to the inlet of the plasma containment vessel.

12. The apparatus of claim 11, wherein the one or more closed recirculation gas loops comprise:
a heat exchanger,
wherein the flue is configured to transport at least one of plasma or heated gas from the outlet of the plasma containment vessel to the heat exchanger,
wherein the heat exchanger is configured to remove thermal energy from the at least one of plasma or heated gas and transfer at least a portion of the thermal energy from the one or more closed recirculation gas loops to a heat sink,
wherein the cold gas return is configured to receive cooled gas from the heat exchanger, wherein the cold gas return is further configured to transport the cooled gas to the inlet of the plasma containment vessel.

13. The apparatus of claim 12, wherein the heat exchanger comprises at least one of a water-cooled heat exchanger or a cryogenic heat exchanger.

14. The apparatus of claim 11, wherein at least one of the flue or the cold gas return comprises one or more pipes.

15. The apparatus of claim 1, wherein the plasma containment vessel comprises:
at least one of a plasma lamp, a plasma cell, or a plasma chamber.

16. The apparatus of claim 1, wherein the one or more closed recirculation gas loops are configured to flow at least one of argon, xenon, neon, or nitrogen through the plasma containment vessel.

17. The apparatus of claim 16, wherein the one or more closed recirculation gas loops are configured to flow a mixture of two or more gases.

18. The apparatus of claim 1, further comprising:
a flow resistance element, wherein the flow resistance element is configured to adjust a flow rate of gas through the one or more closed recirculation gas loops.

19. The apparatus of claim 18, wherein the flow resistance element comprises:
an aperture.

20. The apparatus of claim 18, wherein the flow resistance element comprises:
one or more filters, wherein the one or more filters are fluidically coupled to the one or more closed recirculation gas loops and are configured to clean gas as it returns to the plasma containment vessel.

21. The apparatus of claim 1, further comprising:
a refilling system fluidically coupled to one or more portions of the one or more recirculation gas loops.

22. The apparatus of claim 21, wherein the refilling system comprises:
at least one of a gas inlet or a gas outlet.

23. An apparatus comprising:
a pump source configured to generate laser radiation;
a plasma containment vessel configured to receive the laser radiation from the pump source to sustain a plasma within gas flowed through the plasma containment vessel, wherein the plasma containment vessel is configured to transport gas from an inlet of the plasma containment vessel to an outlet of the plasma containment vessel;
a set of collection optics configured to receive broadband radiation emitted by the plasma sustained within the plasma containment vessel; and
one or more closed recirculation gas loops fluidically coupled to the plasma containment vessel, wherein a first portion of the one or more closed recirculation gas loops is fluidically coupled to the outlet of the plasma containment vessel and is configured to transport at least one of plasma or heated gas out of the plasma containment vessel via the outlet, wherein a second portion of the one or more closed recirculation gas loops is fluidically coupled to the inlet of the plasma containment vessel and is configured to transport cooled gas into the plasma containment vessel via the inlet, wherein the one or more closed recirculation loops are configured to maintain a temperature difference of at least 100° C. between the first portion of the one or more closed recirculation gas loops and the second portion of the one or more closed recirculation gas loops to generate a pressure difference, wherein the first portion is hotter than the second portion.

24. The apparatus of claim 23, wherein the pump source comprises:
at least one of a pulsed laser, a continuous wave (CW) laser, or a modulated CW laser.

25. The apparatus of claim 23, wherein the buoyancy of a plume of the plasma is sufficient to drive recirculation of the gas through the one or more closed recirculation gas loops.

26. The apparatus of claim 23, wherein the energy of a plume of the plasma is sufficient to drive recirculation of the gas through the one or more closed recirculation gas loops.

27. The apparatus of claim 23, wherein the energy of a plume of the plasma is sufficient to drive recirculation of the gas through the one or more closed recirculation gas loops at a velocity greater than or equal to 0.2 m/s.

28. The apparatus of claim 23, wherein the one or more closed recirculation gas loops are configured to generate a plume of the plasma extending at least 1 cm above the plasma.

29. The apparatus of claim 23, wherein the one or more closed recirculation gas loops are configured to generate a pressure difference between gas within the first portion of the one or more closed recirculation gas loops and gas within the second portion of the one or more closed recirculation gas loops to drive gas flow through the one or more closed recirculation gas loops.

30. The apparatus of claim 29, wherein the one or more closed recirculation loops are configured to maintain a temperature difference of at least 100° C. between the first portion of the one or more closed recirculation gas loops and the second portion of the one or more closed recirculation gas loops to generate the pressure difference, wherein the first portion is hotter than the second portion.

31. The apparatus of claim 29, wherein the pressure difference is greater than or equal to 500 Pa.

32. The apparatus of claim 23, further comprising:
one or more additional heat sources, wherein the one or more additional heat sources are configured to at least partially drive recirculation of the gas through the one or more closed recirculation gas loops.

33. The apparatus of claim 23, further comprising:
one or more pumps, wherein the one or more pumps are configured to at least partially drive recirculation of the gas through the one or more closed recirculation gas loops.

34. The apparatus of claim 23, wherein the first portion of the one or more closed recirculation loops comprises a flue fluidically coupled to the outlet of the plasma containment vessel.

35. The apparatus of claim 34, wherein the second portion of the one or more closed recirculation loops comprises a cold gas return fluidically coupled to the inlet of the plasma containment vessel.

36. The apparatus of claim 35, wherein the one or more closed recirculation gas loops comprise:
a heat exchanger,
wherein the flue is configured to transport at least one of plasma or heated gas from the outlet of the plasma containment vessel to the heat exchanger,
wherein the heat exchanger is configured to remove thermal energy from the at least one of plasma or heated gas and transfer at least a portion of the thermal energy from the one or more closed recirculation gas loops to a heat sink,
wherein the cold gas return is configured to receive cooled gas from the heat exchanger, wherein the cold gas return is further configured to transport the cooled gas to the inlet of the plasma containment vessel.

37. The apparatus of claim 36, wherein the heat exchanger comprises at least one of a water-cooled heat exchanger or a cryogenic heat exchanger.

38. The apparatus of claim 35, wherein at least one of the flue or the cold gas return comprises one or more pipes.

39. The apparatus of claim 23, wherein the plasma containment vessel comprises:
at least one of a plasma lamp, a plasma cell, or a plasma chamber.

40. The apparatus of claim 23, wherein the one or more closed recirculation gas loops are configured to flow at least one of argon, xenon, neon, or nitrogen through the plasma containment vessel.

41. The apparatus of claim 40, wherein the one or more closed recirculation gas loops are configured to flow a mixture of two or more gases.

42. The apparatus of claim 23, further comprising:
a flow resistance element, wherein the flow resistance element is configured to adjust a flow rate of gas through the one or more closed recirculation gas loops.

43. The apparatus of claim 42, wherein the flow resistance element comprises:
an aperture.

44. The apparatus of claim 42, wherein the flow resistance element comprises:
one or more filters, wherein the one or more filters are fluidically coupled to the one or more closed recirculation gas loops and are configured to clean gas as it returns to the plasma containment vessel.

45. The apparatus of claim 23, wherein the one or more closed recirculation gas loops comprise one or more open recirculation gas loops.

46. The apparatus of claim 45, further comprising:
a refilling system fluidically coupled to one or more portions of the one or more closed recirculation gas loops.

47. The apparatus of claim 45, wherein the refilling system comprises:
at least one of a gas inlet or a gas outlet.

48. A method comprising:
directing laser radiation into a plasma containment vessel in order to sustain a plasma within a gas flowing through the plasma containment vessel, wherein the plasma emits broadband radiation; and
recirculating the gas through the plasma containment vessel via a closed recirculation gas loop, wherein the recirculating the gas through the plasma containment vessel comprises:
transporting at least one of plasma or heated gas from the plasma containment vessel to a heat exchanger;
cooling the at least one of plasma or heated gas via the heat exchanger; and
transporting cooled gas from the heat exchanger to the plasma containment vessel, wherein a temperature difference of at least 100° C. exists between a first portion of the closed recirculation gas loop and a second portion of the closed recirculation gas loop to generate a pressure difference, wherein the first portion is hotter than the second portion.

49. An apparatus comprising:
a plasma containment vessel configured to receive laser radiation from a pump source to sustain a plasma within gas flowed through the plasma containment vessel, wherein the plasma containment vessel is configured to transport gas from an inlet of the plasma containment vessel to an outlet of the plasma containment vessel, wherein the plasma containment vessel is further configured to transmit at least a portion of broadband radiation emitted by the plasma; and
one or more closed recirculation gas loops fluidically coupled to the plasma containment vessel, wherein a first portion of the one or more closed recirculation gas loops are fluidically coupled to the outlet of the plasma containment vessel and is configured to transport at least one of plasma or heated gas from the outlet of the plasma containment vessel, wherein a second portion of the one or more closed recirculation gas loops is fluidically coupled to the inlet of the plasma containment vessel and is configured to transport cooled gas to the inlet of the plasma containment vessel, wherein the one or more closed recirculation gas loops are configured to generate a plume of the plasma extending at least 1 cm above the plasma.

50. An apparatus comprising:
a pump source configured to generate laser radiation;
a plasma containment vessel configured to receive the laser radiation from the pump source to sustain a plasma within gas flowed through the plasma containment vessel, wherein the plasma containment vessel is configured to transport gas from an inlet of the plasma containment vessel to an outlet of the plasma containment vessel;

a set of collection optics configured to receive broadband radiation emitted by the plasma sustained within the plasma containment vessel; and one or more closed recirculation gas loops fluidically coupled to the plasma containment vessel, wherein a first portion of the one or more closed recirculation gas loops is fluidically coupled to the outlet of the plasma containment vessel and is configured to transport at least one of plasma or heated gas out of the plasma containment vessel via the outlet, wherein a second portion of the one or more closed recirculation gas loops is fluidically coupled to the inlet of the plasma containment vessel and is configured to transport cooled gas into the plasma containment vessel via the inlet, wherein the one or more closed recirculation gas loops are configured to generate a plume of the plasma extending at least 1 cm above the plasma.

* * * * *